United States Patent [19]

Takemura

[11] E Patent Number: Re. 32,492

[45] Reissued Date of Patent: Sep. 1, 1987

[54] SOLID-STATE COLOR TELEVISION CAMERA DEVICE

[75] Inventor: Yasuo Takemura, Tokyo, Japan

[73] Assignee: Tokyo Shibaura Denki Kabushiki Kaisha, Kawasaki, Japan

[21] Appl. No.: 878,631

[22] Filed: Jun. 26, 1986

Related U.S. Patent Documents

Reissue of:

[64] Patent No.: 4,460,919
Issued: Jul. 17, 1984
Appl. No.: 380,145
Filed: May 20, 1982

[30] Foreign Application Priority Data

Jun. 10, 1981 [JP] Japan ..... 56-88248

[51] Int. Cl.[4] ..... H04N 9/07
[52] U.S. Cl. ..... 358/44
[58] Field of Search ..... 358/41, 43, 44, 47, 358/213

[56] References Cited

U.S. PATENT DOCUMENTS

| | | | |
|---|---|---|---|
| 3,982,274 | 9/1976 | Chai | 358/44 |
| 4,392,158 | 7/1983 | Aoki | 358/213 |
| 4,450,475 | 5/1984 | Ishikawa | 358/44 |
| 4,500,914 | 2/1985 | Watanabe | 358/44 |
| 4,567,510 | 1/1986 | Tanaka | 358/44 |

FOREIGN PATENT DOCUMENTS

| | | | |
|---|---|---|---|
| 55-0675 | 1/1980 | Japan | 350/44 |

*Primary Examiner*—Michael A. Masinick
*Attorney, Agent, or Firm*—Banner, Birch, McKie & Beckett

[57] ABSTRACT

According to the invention, a photosensor array having a plurality of photosensors are formed in horizontal and vertical rows on a semiconductor substrate. Vertical charge transfer electrodes are provided along the vertical rows of photosensors for transferring the charges generated in the photosensors along the vertical direction. Charge mixing means are provided, within the substrate, for mixing the charges generated by the photosensors in successive two horizontal rows of photosensors.

14 Claims, 20 Drawing Figures

SOLID-STATE COLOR TELEVISION CAMERA DEVICE

Matter enclosed in heavy brackets [ ] appears in the original patent but forms no part of this reissue specification; matter printed in italics indicates the additions made by reissue.

BACKGROUND OF THE INVENTION

This invention relates to a color television camera device which uses a solid-state image pickup device. In particular, it relates to a device using a solid-state pickup device whereby signals in two successive horizontal lines are simultaneously read out during every horizontal scanning period.

In conventional solid-state color image pickup devices, a color filter array is provided on the surface of a photosensor array formed in a semiconductor substrate. With the increasing need for utilizing semiconductor image pickup devices, there existed a problem of registration between the filter array and photosensor array. The prior art has proposed to overcome this problem by simultaneously reading out two successive lines of signals during every horizontal scanning period; these lines of signals are then processed to obtain the color signals (see Japan Patent Publication No. 56-37756). The proposed device, however, has a complex integrated structure for simultaneously reading out the two successive lines of signals and is difficult and costly to manufacture such a device.

SUMMARY OF THE INVENTION

It is an object of the invention to provide an improved color image pickup device utilizing simplified circuitry, whereby image signals in successive two lines are simultaneously read out during every horizontal scanning period.

It is another object of the invention to provide a novel color filter array suitable for simultaneous reading out the image signals in successive two lines with interlaced scanning.

According to the invention, a photosensor array having a plurality of photosensors are formed in horizontal and vertical rows on a semiconductor substrate. Vertical charge transfer electrodes are provided along the vertical rows of photosensors for transferring the charges generated in the photosensors along the vertical direction. Charge mixing means are provided, within the substrate, for mixing the charges generated by the photosensors in successive two horizontal rows of photosensors.

In one embodiment utilizing the so-called interline transfer type CCD, a charge gating electrode is provided between each photosensor and the vertical transfer electrodes. This gating electrode gates, transfers and permits mixing of, the charges generated in two adjacent horizontal rows of photosensors at the beginning of the vertical transfer period. A first gating electrode transfers the charges along the first row of each row pair to the vertical transfer electrode. As the charge of each first row is transferred down the vertical transfer rows and reaches the second row of the row pair, a second gating electrode transfers the charge of the second row to the transfer means. This results in a mixing of the charges of the first and second row.

A horizontal transfer means is provided for receiving the charges transferred by the vertical transfer means and for horizontally transferring the image signals to a signal processor which converts these signals to standard color television signals. A color filter array is provided on the surface of the solid-state image pickup device. The color filter array has a plurality of filter elements, each corresponding to a photosensor. Each filter element consists of the following four different colors: yellow (Ye), green (G), cyan (Cy) and white (W). In the color filter array, a unit array of $2\times4$ elements is repeated, horizontally and vertically. This unit array is formed such that an output image signal obtained from one horizontal photosensor row includes signals modulated by at least a first and second primary colors with different phases and having the same repetition cycle, while the output image signal obtained from an adjacent horizontal photosensor row includes signals modulated by at least the first and second primary colors having the same phases and repetition cycle (see, e.g., FIG. 5: $L_1$, $L_2$). The first and second colors are preferably R and B, respectfully.

According to another embodiment of the invention, the so-called frame transfer type CCD image pickup device is utilized. With this device, during a storage time, mixing signals are applied to the vertical transfer electrodes prior to [transfering] *transferring* the charges to the storage area. More specifically, the mixing signals drive two pairs of adjacent vertical electrodes, corresponding to two adjacent filter elements. One pair corresponds to one filter element and the other pair corresponds to a different adjacent filter element. A potential well is formed which is common to the two middle electrodes for mixing the charges generated by the colors passing through the different adjacent filter elements.

BRIEF DESCRIPTION OF THE DRAWINGS

A complete understanding of the present invention and of the above and other objects thereof may be gained from a consideration of the following detailed description of the specific illustrative embodiments thereof presented hereinafter in connection with the accompanying drawings, in which.

Figure 1:
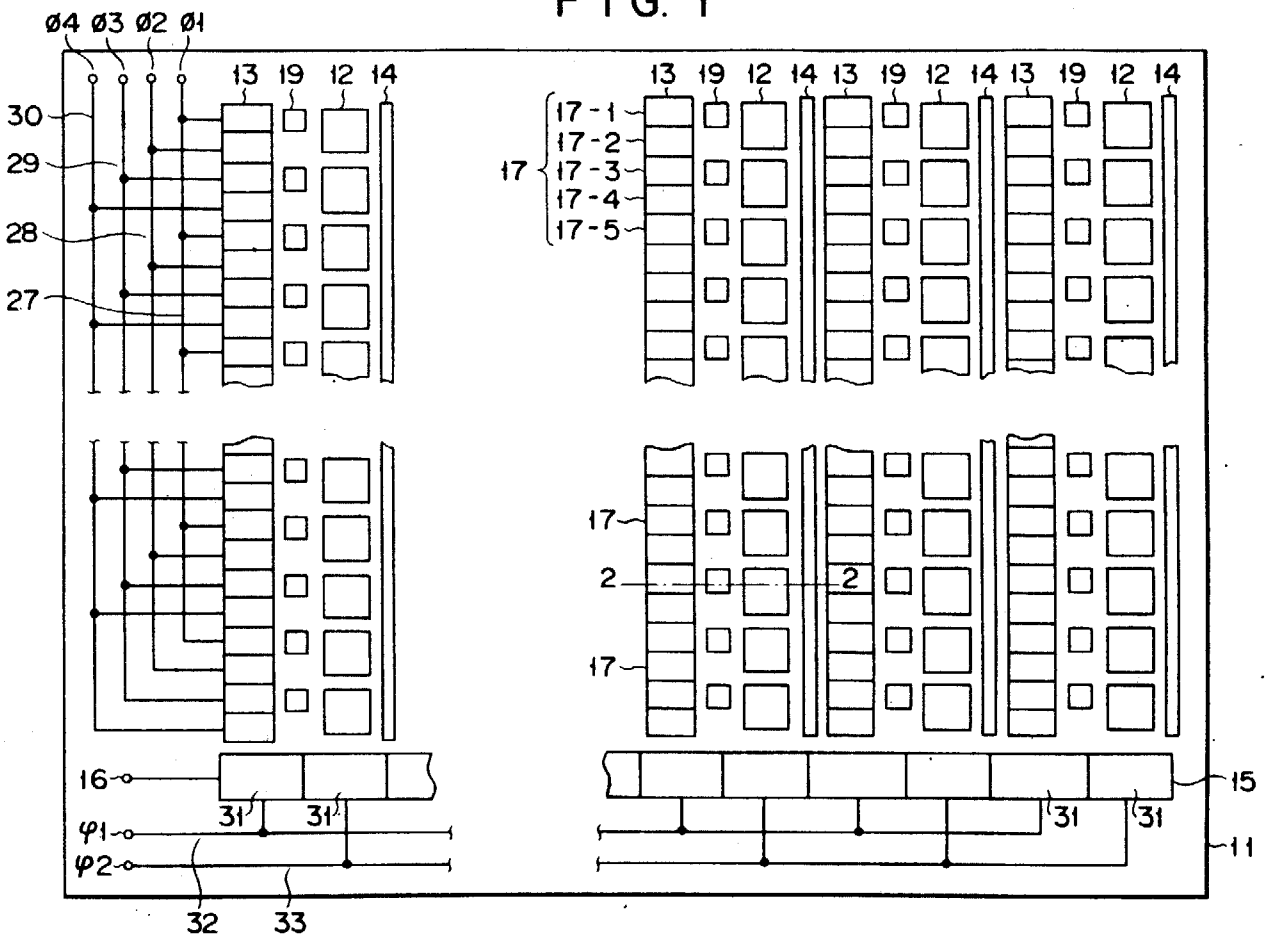
FIG. 1 schematically shows an embodiment of a CCD image pickup device according to the invention.
Figure 8:
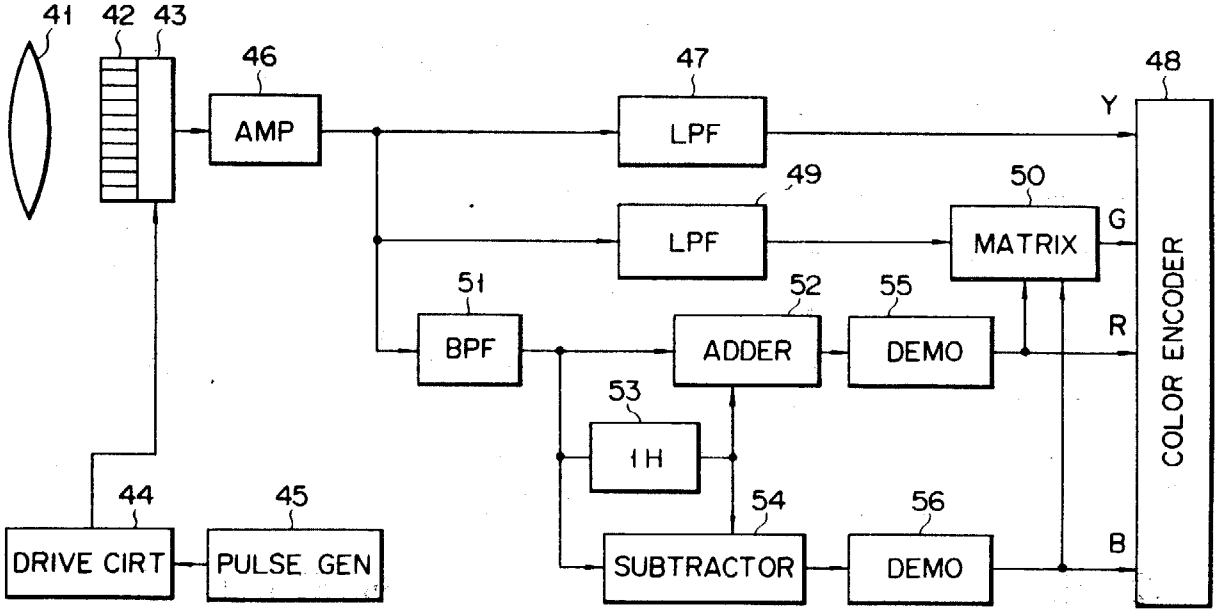
Figure 10:
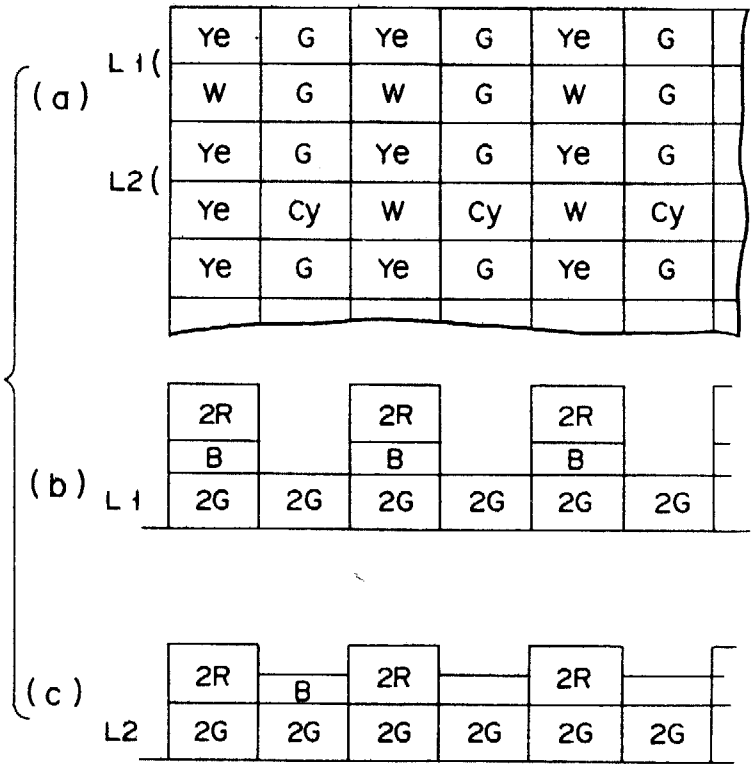
Figure 9:
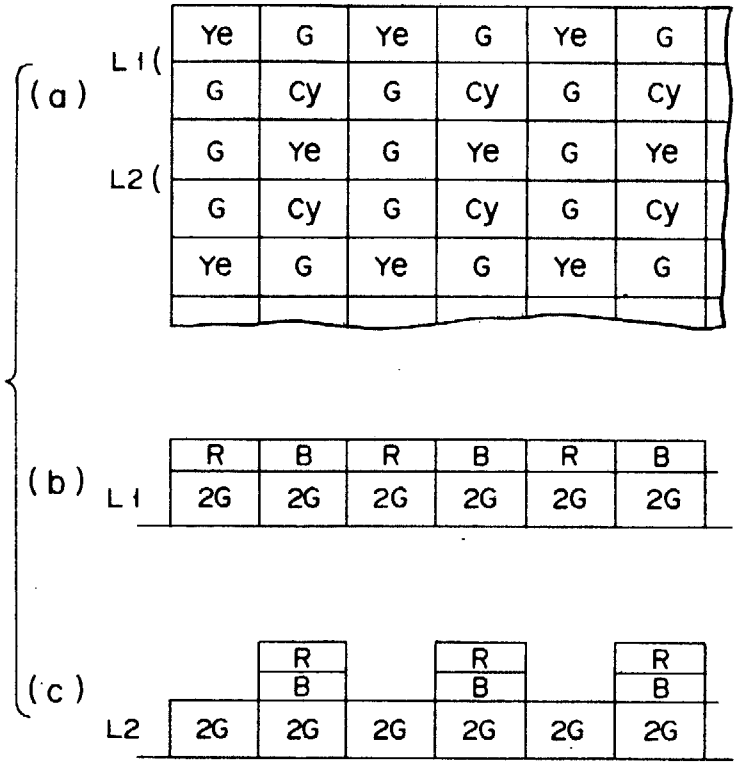
Figure 12:
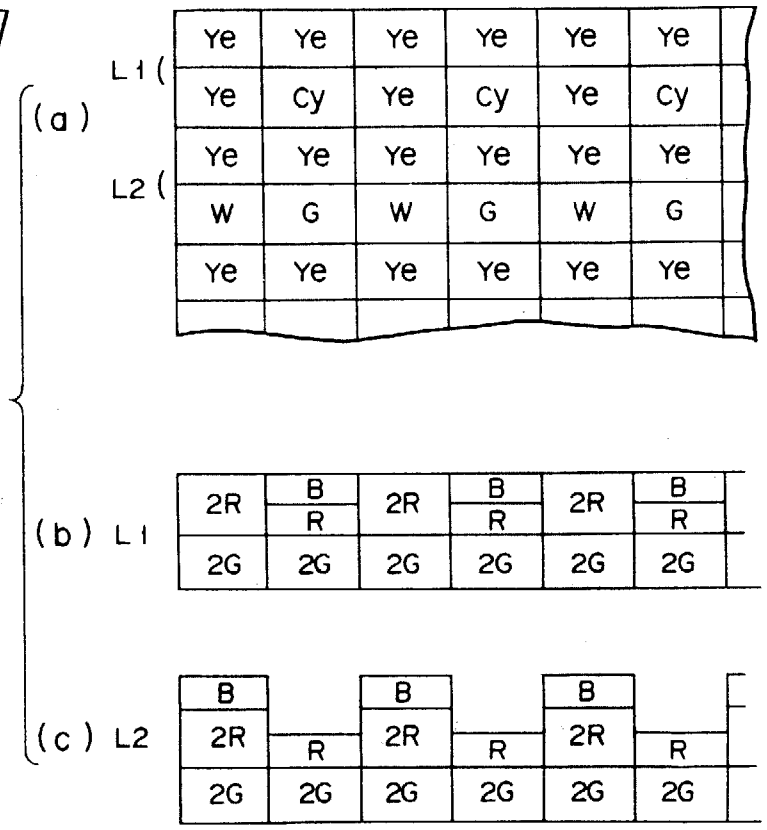
Figure 11:
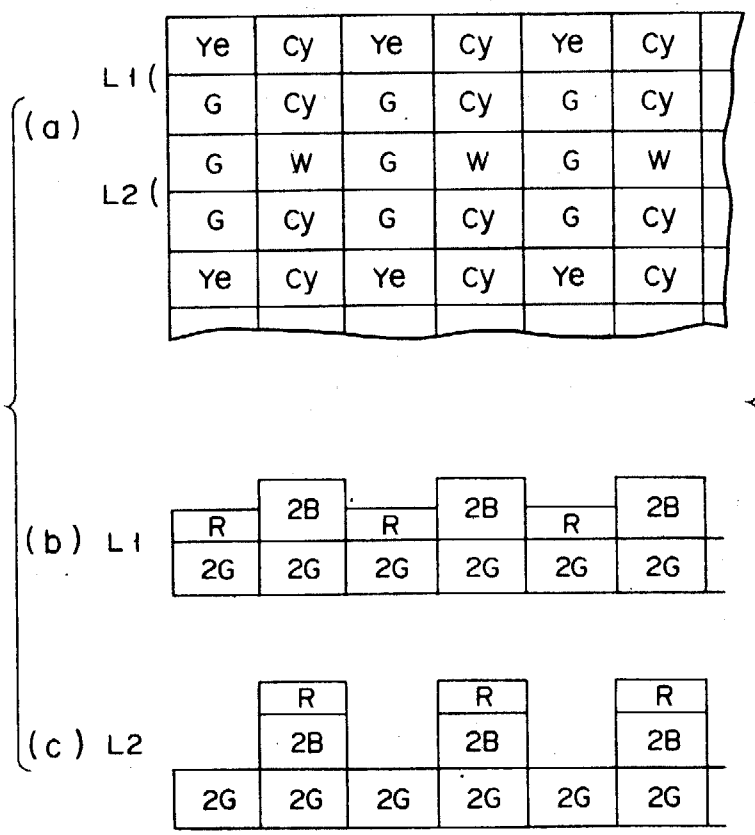
Figure 14:
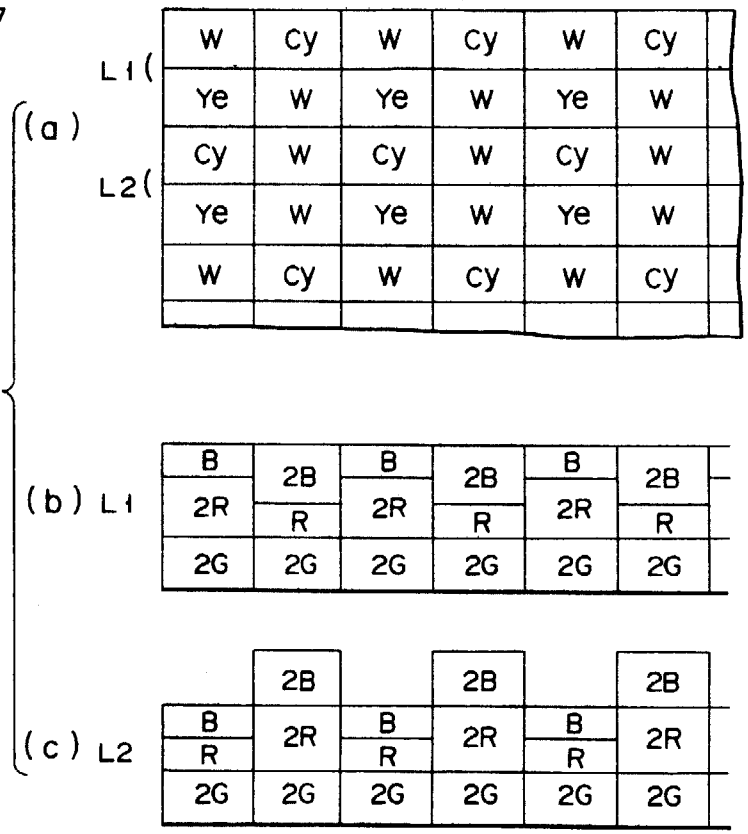
Figure 13:
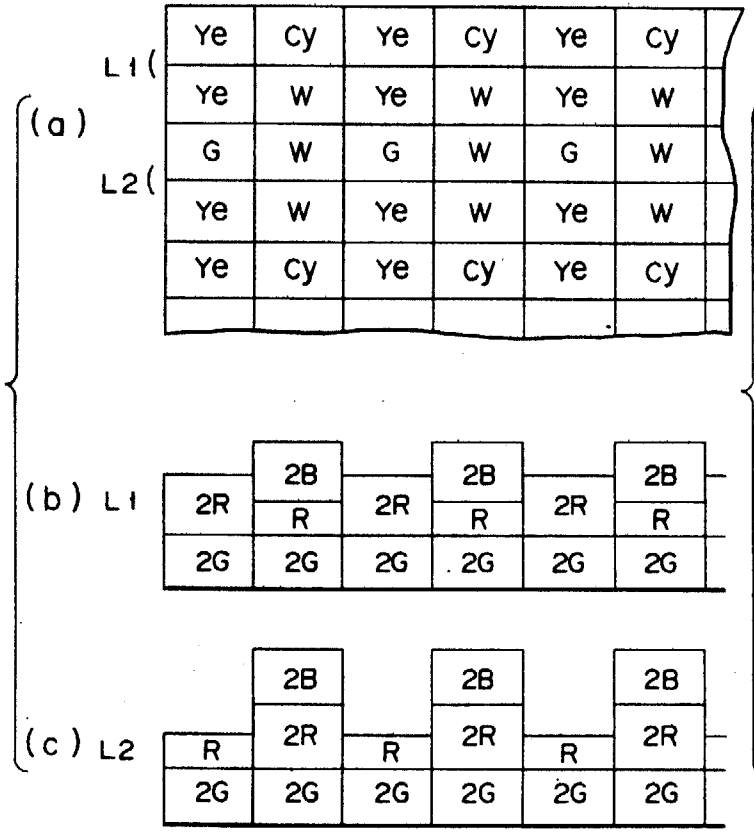
Figure 15:
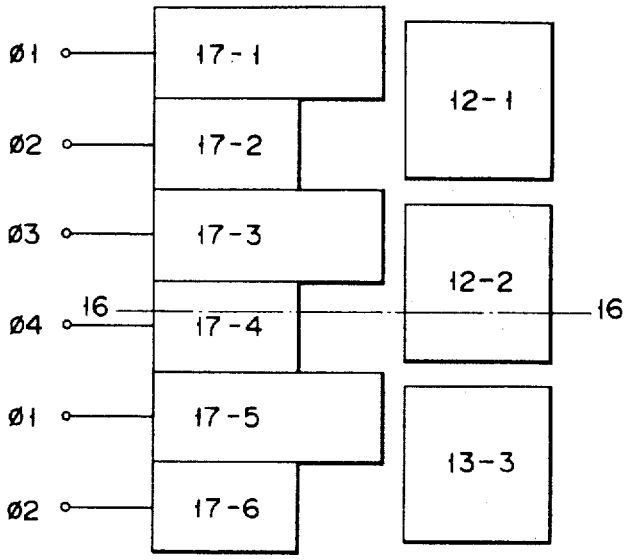
Figure 16:
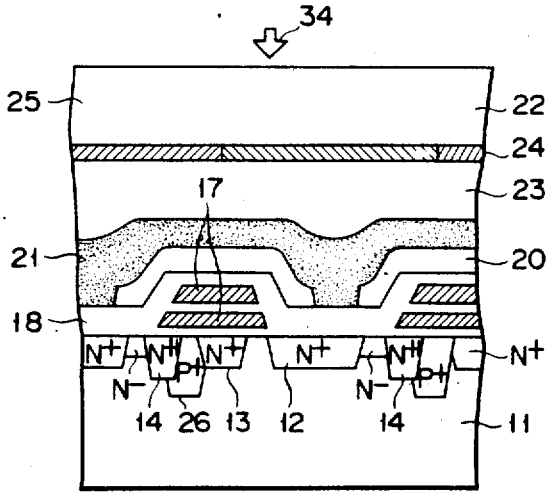
Figure 17:
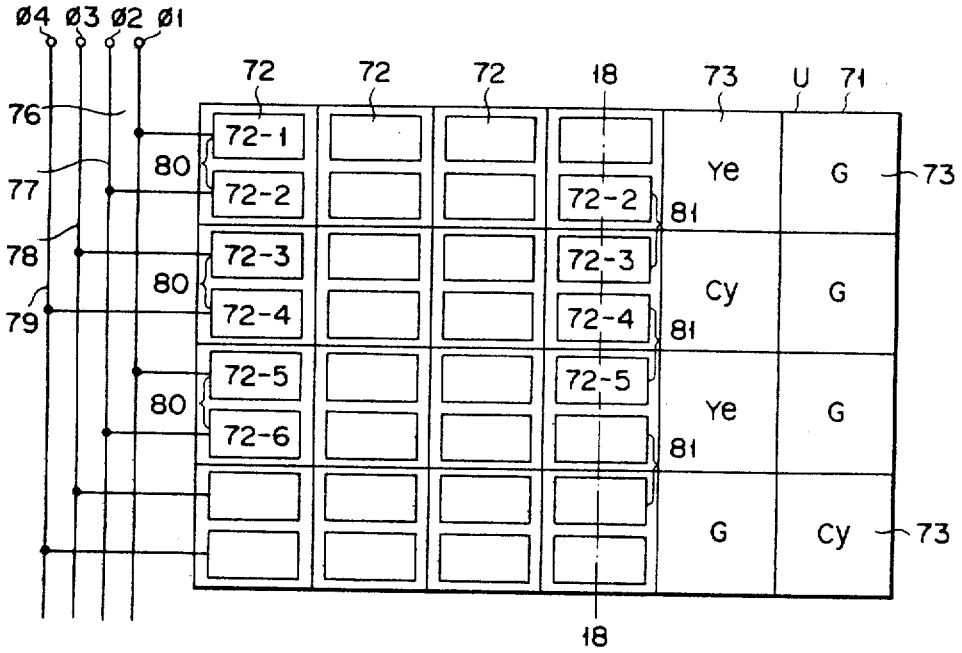
Figure 18A:
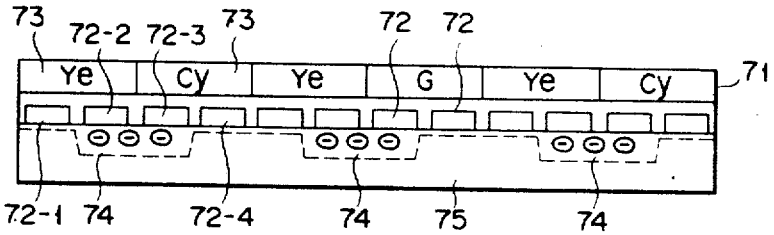
Figure 18B:
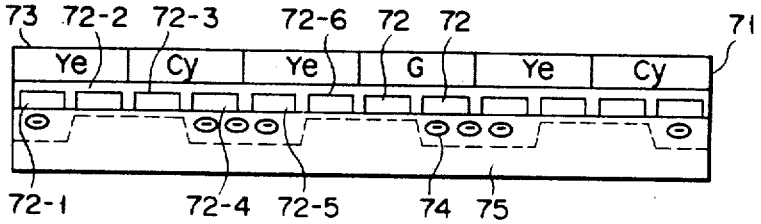
Figure 19:
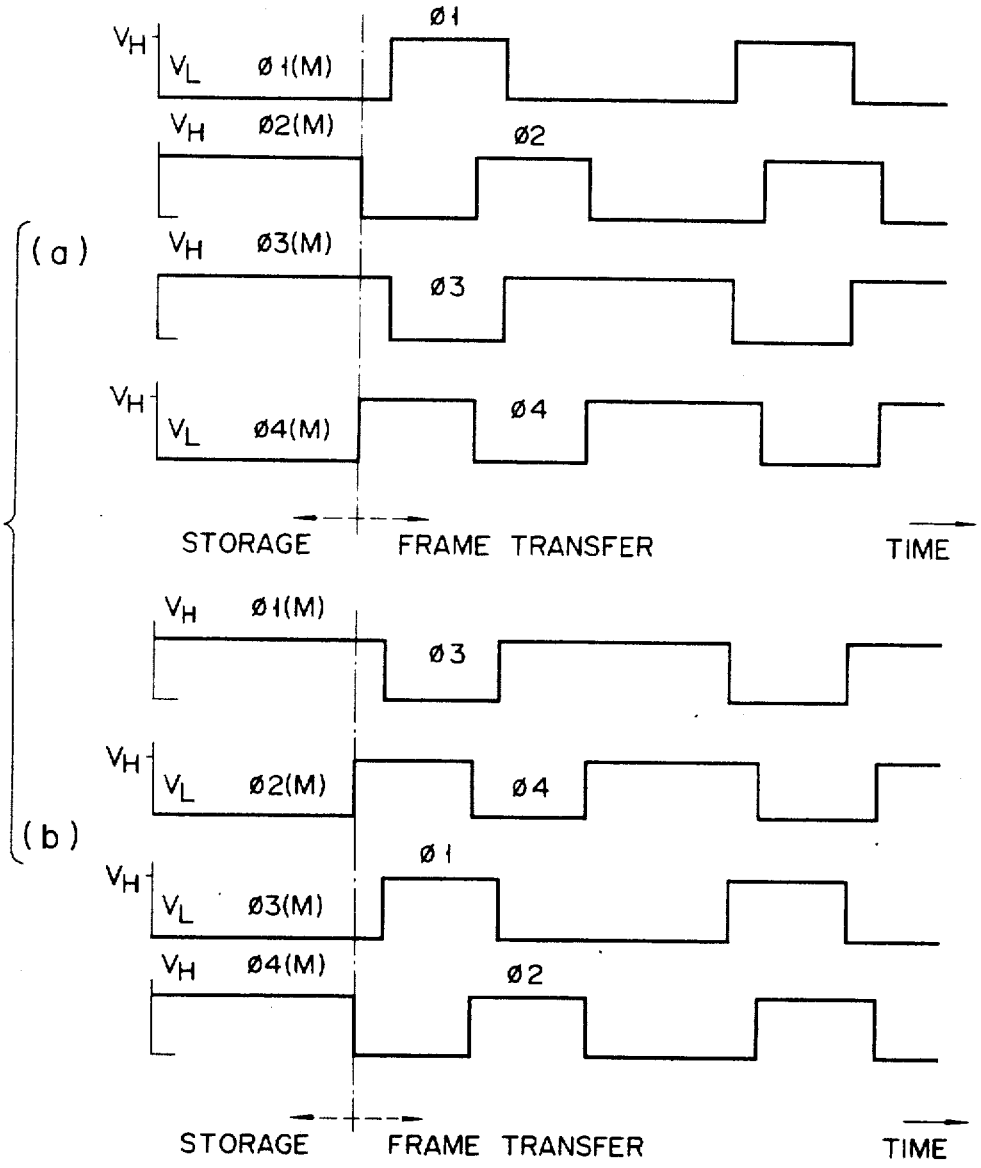

FIGS. [6a–6b] *6(a)–6(b)* are diagrams of waveforms of the vertical transfer drive signals utilized in the embodiment of the present invention shown in FIG. 1;

FIGS. [7a–7b] *7(a)–7(b)* schematically show the gating and mixing process carried out in the embodiment of the invention shown in FIG. 1;

FIG. 8 [shows] *show* a block diagram of the signal processing circuitry incorporated in the embodiments of the invention;

FIGS. 9–14 [shows] *show* different embodiments of color filter arrays according to the invention;

FIG. 15 is a plan view of a further embodiment of the invention shown in FIG. 1;

FIG. 16 schematically shows a cross sectional view taken along a line 16—16 in FIG. 15;

FIG. 17 shows a plan view of CCD device according to another embodiment of the invention;

FIG. 18 schematically shows a cross sectional view taken along a line 18—18 in FIG. 17; and FIG. 19 is a diagram of waveforms of the vertical drive signals utilized in the embodiment shown in FIG. 17.

DETAILED DESCRIPTION OF THE PREFERRED EMBODIMENT

FIG. 1 shows a plan view of a CCD color image pickup device made in accordance with the present invention. A p-type silicon semiconductor substrate 11 is provided on which a number of photodiodes or photosensors 12 are formed on the surface thereof. The photosensors 12 are arranged in a matrix pattern having 492 horizontal rows and 380 vertical rows. This provides, for example, a photosensitive area of $6.6\times8.8$ $mm^2$. Vertical transfer channels 13 and overlfow drains 14 are placed between each vertical rows of photosensors 12. A horizontal transfer channel 15 is placed at the common end of the vertical transfer channels 13. An output terminal 16 is provided at the end of the horizontal transfer channel 15.

Figure 2:
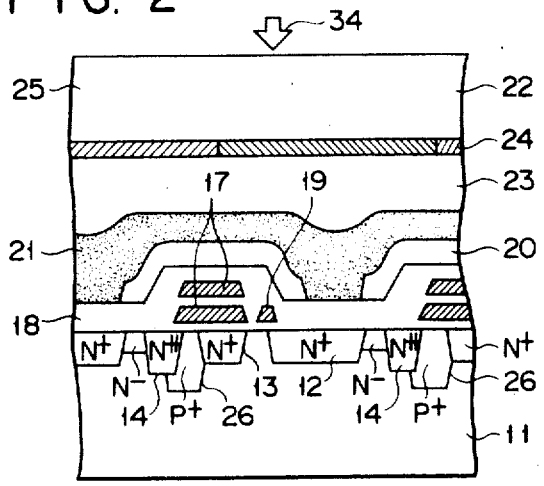
FIG. 2 schematically shows a cross-sectional view of the CCD device taken along a line 2—2 in FIG. 1.

A partial cross sectional view of the CCD device taken along the line 2—2 in FIG. 1 is schematically shown in FIG. 2 together with a color filter array provided on the surface of the CCD device. Photodiodes 12 are formed by a N+-type diffused region at the surface of the P-type substrate 11. Vertical transfer channels 13 are also N+-type diffused areas extending along the vertical rows of photosensors 12. Positioned over vertical transfer channels 13 are transfer electrodes 17 made of polysilicon buried in a $SiO_2$ layer 18 on the surface of substrate 11. Two vertical transfer electrodes 17, partly overlapping each other, are provided for each photosensor 12. Between photosensor region 12 and vertical transfer channel regions 13, a charge gating electrode 19 is provided which gates and transfers charges produced in photosensor regions 12 to the vertical channel region. Gate electrodes 19 are activated when transfer signals are applied, as explained later. Aluminum light shield layers 20 are provided on the $SiO_2$ layer 18. Except for the photosensor areas 12, light shield layers 20 covers the entire surface area. Light shield layers 20 are electrically biased so that any excess charges generated in photosensor area 12 will flow into overflow drains 14, instead of flowing into vertical transfer channels 13. Overflow [chains] *drains* 14 are formed of N++ diffused regions. Light shield layers 20 and $SiO_2$ layers 18 are coated by PSG glass layer 21. Positioned over PSG glass layer 21, a color filter array 22 is laminated by a binding layer 23. Color filter array 22 has filter elements 24 arrayed on the lower surface of a glass substrate 25. The P+ regions 26 shown in FIG. 2 are channel stopping regions which isolate vertical transfer channels 13 from overflow drains 14.

Four transfer drive signals $\Phi_1$–$\Phi_4$ are supplied to vertical transfer electrodes 13 through drive lines 27–30. Each respective drive line is connected to a corresponding vertical transfer electrode 17, as shown in FIG. 1. For example, as shown in FIG. [7(A)] *7(a)*, $\Phi_1$ is connected to electrode 17-1, $\Phi_2$ is connected to electrode 17-2, $\Phi_3$ is connected to electrode 17-3, and $\Phi_4$ is connected to electrode 17-4. Likewise, $\Phi_1$ would also be connected to electrode 17-5, et cetera. Each horizontal drive line is connected in common with all the vertical transfer electrodes 17 arranged along the same horizontal lines (not shown in FIG. 1). Drive lines 27 and 29 are also connected to charge gating electrodes 19. For example, as shown in FIG. [7a] *7(a)*, line 27 is connected to gate 19-1 while line 29 is connected to gate 19-2. Horizontal transfer electrodes 31 are arrayed along the surface of horizontal transfer channel 15. These electrodes are provided so that each electrode corresponds to a respective vertical array of vertical transfer electrodes 17 and photosensor array 12. Two phase drive signals $\phi_1$, and $\phi_2$ are supplied, through drive lines 32 and 33, to horizontal transfer electrodes 31. Drive lines 32 and 33 are alternately connected to transfer channel 15.

Figure 3:
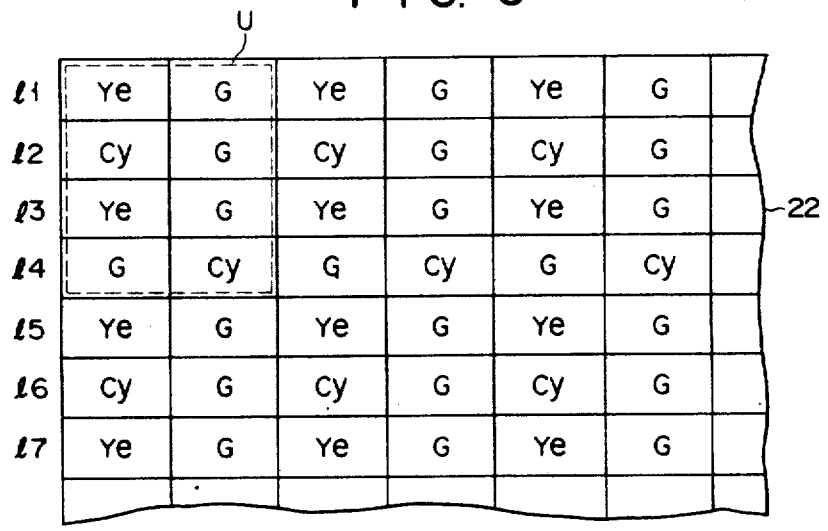
FIG. 3 shows a portion of a color filter array incorporated in the embodiments of the present invention.

FIG. 3 schematically shows a filter array 22 of FIG. 2. Each filter element corresponds to a respective photosensor. Only a portion of the filter array having $492\times380$ elements, each having an area of $13\times32$ $mm^2$, is shown in FIG. 3. This filter array comprises the following three different color filter elements: green (G), yellow (Ye) and cyan (Cy). The green elements pass only green light. The yellow elements pass only red (R) and green (G) light. The cyan elements pass only green (G) and blue light. In the first horizontal row [$1_1$] *l1* (FIG. 3), the Ye and G elements are alternately arranged. In the second row [12] *l2*, the Cy and G elements are alternately arranged in the same manner as the first row. The third row [13] *l3* is identical to the first row. In the fourth row [14] *l4*, G and Cy are alternately arranged in the same manner as the first row. Therefore, the filter array comprises a number of array units, each unit comprising $2\times4$ element array, as shown by dotted line U; this unit array is repeated horizontally and vertically.

Operation of the solid-state image pickup device according to the invention will now be explained. Incident image light, shown by arrow 34 in FIG. 2, is divided into component colors while passing through filter array 22. Each component color light is converted into an electrical charge by photosensor 12 and temporarily stored therein. The charge is read out, under the control of charge gating electrodes 19, into vertical transfer channel 13.

Figure 6:
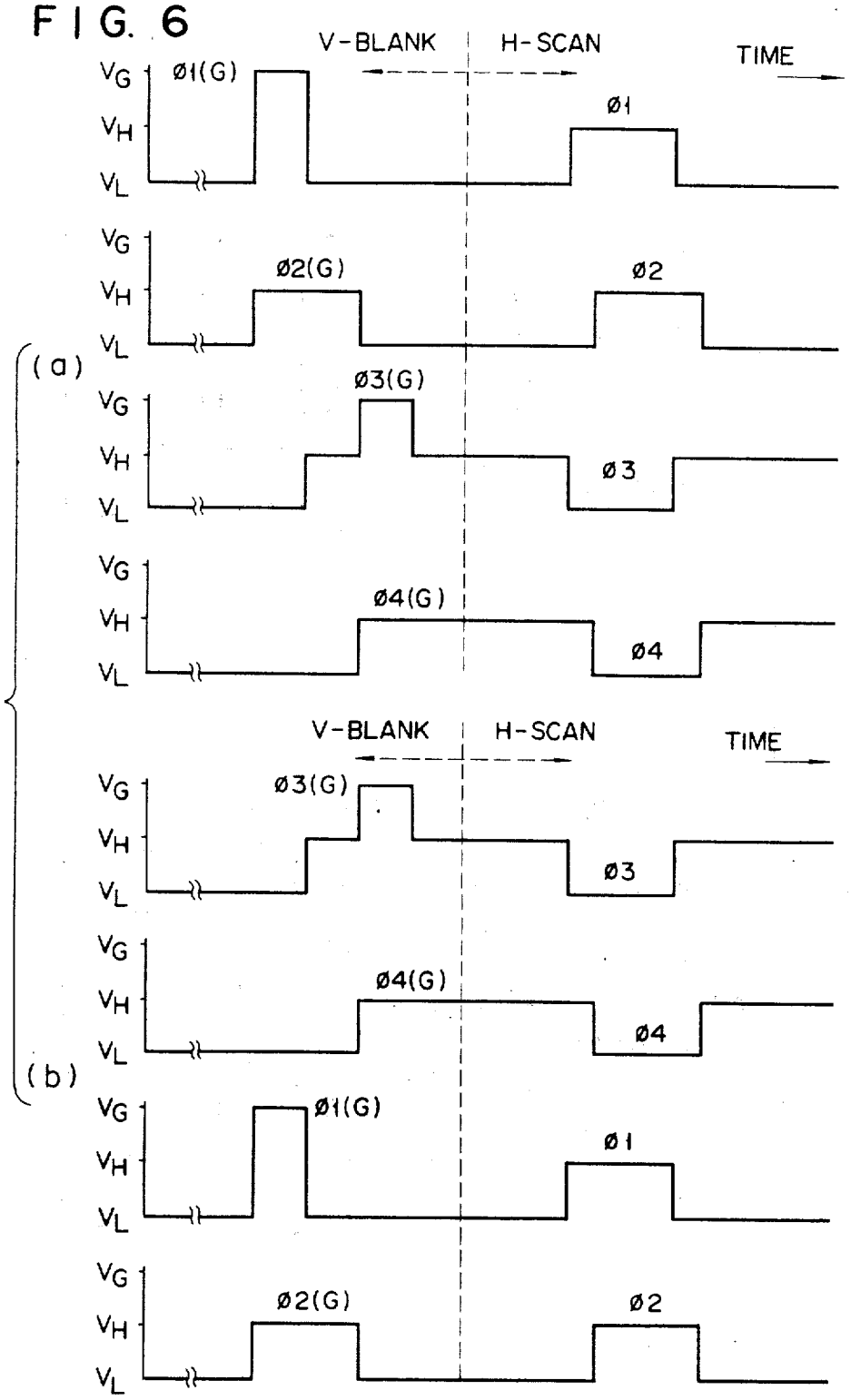

In scanning the odd fields, a set of gating signals Φ1(G)–Φ4(G) (FIG. 6(a)) are applied to vertical transfer electrodes 13 through drive lines 27–30. The coupling signals are superimposed on 4-phase drive signals Φ1–Φ4 at the end of vertical blanking period of the television display system before the vertical transfer period begins. The enlarged view of FIG. 7(a) explains the mixing of the charge. The gating signals Φ1(G)–Φ4(G) are applied to input terminals 35-1-35-4, respectively. When gate signal Φ1(G) is applied to vertical transfer electrode 17-1 through input terminal 35-1, gate electrode 19-1 is biased to form a deep potential well in the region under electrode 19-1. During a first gating sequence, the charge stored in photosensor 12-1 is then transferred to the vertical transfer channel 13 by passing under vertical transfer electrode 17-1, as shown by arrow 36. When gate signal Φ2(G) is applied, the charge under electrode 17-1 transferred to the channel region under electrode 17-2. During a second gating sequence, the gate signal Φ3(G) is applied and gate electrode 19-2 is likewise biased to form a deep potential well under electrode 19-2. The charge stored in photosensor 12-2 is thus transferred via electrode 19-2 into the channel region under electrode 17-3, as shown by dotted arrow 37. Simultaneously, the charge under electrode 17-2 is transferred to the region under electrode 17-3. In this channel region the charge generated in sensors 12-1 and 12-2 are mixed together. By applying gate signal Φ4(G), the mixed charge is transferred along vertical channel 13 to the adjacent region under electrode 17-4.

Since gating signals Φ1(G)–Φ4(G) are provided just prior to the beginning of every field scanning period, the photosensor charges are read out and transferred to, and mixed in, the vertical transfer channel. They are then transferred toward the horizontal transfer channel during the field scanning period during which time the vertical transfer signals Φ1–Φ4 are cyclically applied to the vertical transfer electrodes 17. In this way, the charge generated by each photosensor in an odd horizontal row is mixed with the charge generated by a photosensor in an adjacent horizontal row. Image signals for odd horizontal lines thus formed are transferred, in horizontal transfer channel 15, toward output terminal 16 in response to horizontal drive signal $\phi_1$ and $\phi_2$. Output terminal 16 then supplies the color image signals to a signal processor.

In scanning the even fields, photosensors in even rows are first read out and the charge generated in each photosensor is mixed with the charge generated by photosensors in next adjacent horizontal rows, as shown by FIGS. 6(b) and 7(b). From these figures, it is noticed that the order of 4-phase transfer signals Φ1, Φ2, Φ3, Φ4 is changed to the order Φ3, Φ4, Φ1, Φ2. This change in the order of the transfer signals can be accomplished by switching a 4-phase clock pulse generator included in pulse generator 45 (FIG. 8) with field index pulses, generated at the beginning of every odd field. Thus, during a first gating sequence the charge in photosensor 12-2 is transferred to vertical transfer channel 13 by applying gating signal Φ1(G) to gate electrode 19-2 as shown by arrow 27. By applying gating signal Φ2(G) to transfer electrode 17-4, the charge under electrode 17-3 is transferred to the region under electrode 17-4. During a second gating sequence, the gating signal Φ3(G) is applied to transfer electrode 17-5. The charge in photosensor 12-3 is thus transferred into vertical transfer channel, as shown by dotted arrow 39, under the control of gate electrode 19-3 which is also driven by gating signal Φ3(G). Simultaneously, the charge under electrode 17-4 is transferred to the region under electrode 17-5 where this charge is mixed with the charge from photosensor 12-3. Gating signal Φ4(G) transfers the mixed charge to the region under electrode 17-6. Subsequently, drive signals Φ1–Φ4 continue to transfer the charges toward horizontal transfer channel 15. Thus, even lines of image signals are obtained at output terminal 16. In this way interlace scanning is carried out.

Figure 4:
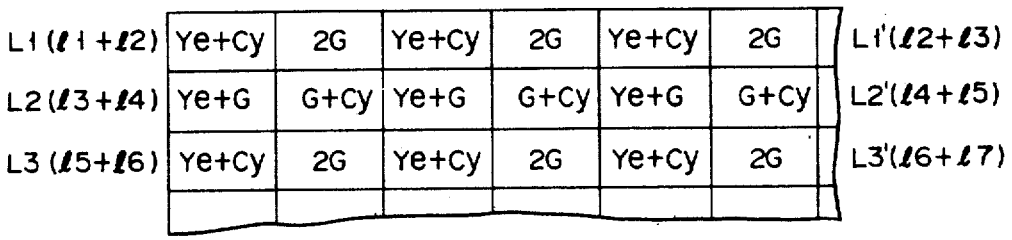
FIG. 4 is a diagram for explaining the operation of the embodiment of the invention shown in FIG. 1.

Color signal processing will now be explained. FIG. 8 shows a schematic diagram of a so-called single-plate type color television camera system incorporating the CCD device mentioned above. Incident image light passing through a lens 41 and a color filter array 42 (e.g., the one shown in FIG. 3), projects an image on the surface of a CCD image pickup device 43 (e.g., FIG. 1). CCD device 43 is driven by pulse signals fed to it from a drive circuit 44. Drive circuit 44 generates various kinds of pulse signals which are required for the CCD device 43 to generate its output image signal. Drive circuit 44 is coupled to pulse generator 45 which generates timing pulses for controlling the camera system shown in FIG. 8. Color signal components obtained by each horizontal scanning of the CCD device are shown in FIG. 4. The signal in the first odd horizontal line L1 is a sum of the signals generated by light components passed through the filter elements in the first and second horizontal row [$L_1$] *l1* and [$L_2$] *l2* of FIG. 3. If this relationship is expressed as [$L1=L_1+L_2$] $L1=l1+l2$, then L2 and L3 are respectively expressed as [$L2=L_3+L_4$, $L3=L_5+L_6$] $L2=l3+l4$, $L3=l5+l6$. Horizontal scanning lines L1, L2, L3 . . . are those that occur during the odd field scanning period of interlaced scanning.

Figure 5:
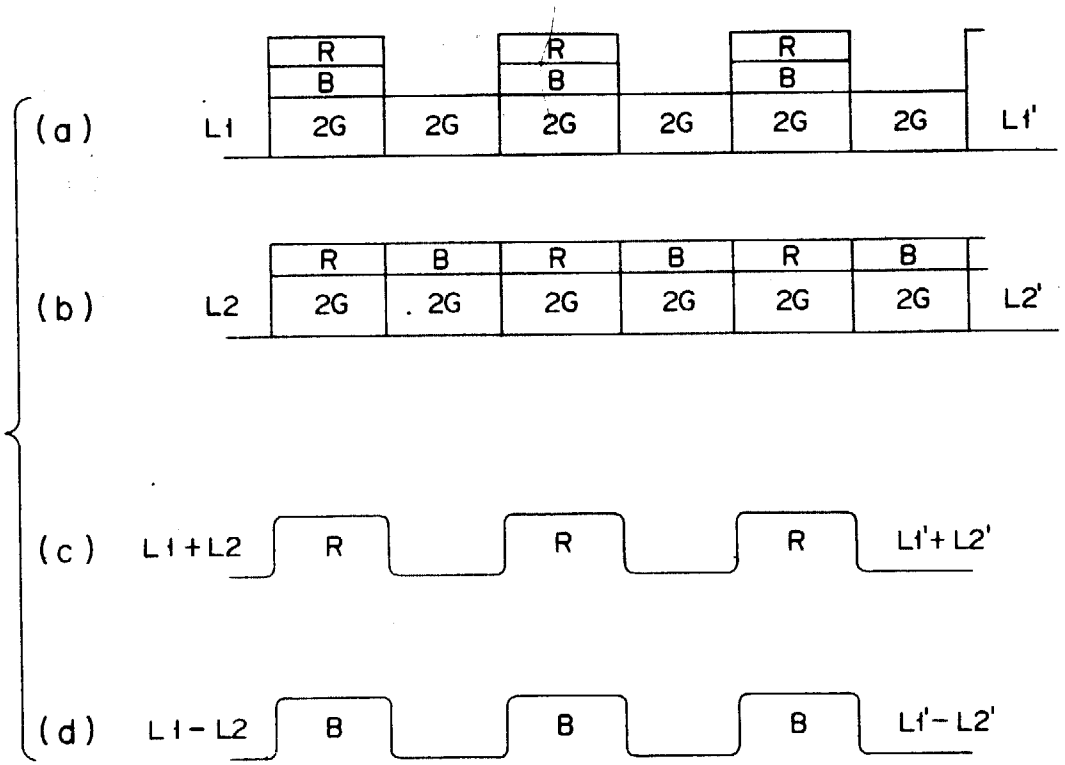
FIGS. 5(a)–5(d) are diagrams for explaining the processing of signals in the embodiment of the invention shown in FIG. 1.

On the other hand, during even field scanning, the signal in the first horizontal line L1' represents the sum of the signals generated by light components passed through the color filter elements in the second and third row [$L_2$, $L_3$] *l2, l3* of FIG. 3. Thus, the relationship between L1' and [$L_2$, $L_3$] *l2, l3* is again expressed as: [$L1'=L_2+L_3$] $L1'=l2+l3$. Similarly, L2', L3' are respectively expressed as: [$L2'=L_4+L_5$, $L3'=L_6=L_7$] $L2'=l4+l5$, $L3'=l6+l7$. In the first horizontal line L1, color signal Ye+Cy and 2G alternately appear. Signal Ye+Cy can be expressed as R+2G+B, since signal Ye and Cy are respectively expressed as R+G and G+B. Accordingly, in horizontal line L1, R+2G+B and 2G signals are alternately repeated as shown in FIG. 5(a). Similarly, signals R+2G and B+2G are alternately repeated along horizontal line L2 as shown in FIG. 5(b). The cycle of these signals is selected as 3.58 MHz which is the color subcarrier signal frequency for NTSC color television signals. It should be noted that the color filter array, according to the invention, is so designed that the color signals obtained during every horizontal scanning of odd fields are the same as those obtained during even field scanning.

Returning to FIG. 8, the output signal from CCD device 43 is supplied to a wide band amplifier 46. Amplifier 46 may be an amplifier having a sample and hold function controlled by output pulses from pulse generator 45. The output signal from amplifier 46 passes through a first low pass filter (LPF) 47 which passes frequencies below 3 MHz to provide a luminance signal Y at its output. Luminance signal Y is then fed to a color encoder 48. The output signal of amplifier 46 is supplied to a second LPF 49 which passes frequencies below 0.5 MHz to provide a low frequency color signal at its output. This low frequency color signal is fed to a color matrix circuit 50. The output signal of amplifier 46 further passes through a band pass filter (BPF) 51 which passes frequencies from 3 MHz to 4 MHz, centered approximately at 3.58 MHz. A color subcarrier signal having 3.85 MHz frequency modulated by R and B color component lights is extracted at the output of BPF 51.

The output signal of BPF 51 is fed to an adder circuit 52, a 1 H delay circuit 53 and a [substractor] *subtractor* circuit 54. Delay circuit 53 provides a delay time of one horizontal scanning period. The output signal from 1H delay circuit 53 is supplied to adder circuit 52 and to subtractor circuit [84] *54*. When the subcarrier modulated by color signals R and B in the second horizontal line L2 (shown in FIG. 5(b)) is supplied to the input of addition circuit 52, the subcarrier modulated by R and B signals in the first line L1 (shown in FIG. 5(a)) is supplied to another input of addition circuit 52 via 1H delay circuit 53. With regard to the color modulated components in two adjacent horizontal lines, the R components are in phase and B components are out of phase by 180° (See FIGS. 5(a) and (b)). Consequently, a subcarrier modulated by only R components is obtained at the output of addition circuit 52. Similarly, a subcarrier modulated by only B components is obtained at the output of subtraction circuit 54. These color modulated subcarrier signals are then demodulated by a first and second demodulation circuit 55 and 56 to obtain R and B low frequency signals, respectively, as shown in FIGS. 5(c) and (d). On the other hand, the signal which has passed through the second LPF 49 is converted to an unmodulated low frequency signal with an amplitude of $R/2+2G+B/2$ and is supplied to color matrix circuit 50 together with the R and B low frequency signals obtained from first and second demodulation circuits 55 and 56. Matrix circuit 50 generates a low frequency G signal by processing these three input color signals. Luminance signal Y from first LPF 47 and the three color signals R, G and B thus obtained are supplied to a color encoder 57, which generates NTSC color television signals.

It should be noted that there are various modifications within the scope of the invention. Especially, color filter array can be modified as shown in FIGS. 9–14. Shown in these figures, for simplicity, are the filter pattern of only [6×6] *6×5* elements. The use of the color filter arrays according to the invention simplifies the process for manufacturing the filter arrays since overlapped portions of Ye and Cy form G filter elements. Practically, only two different kinds of processes (i.e., forming Ye and Cy elements) need be used to produce the required four different color elements: Ye, G, Cy and W. Thus, the manufacturing steps are reduced to half or one third of those required for conventional processes.

Figure 7:
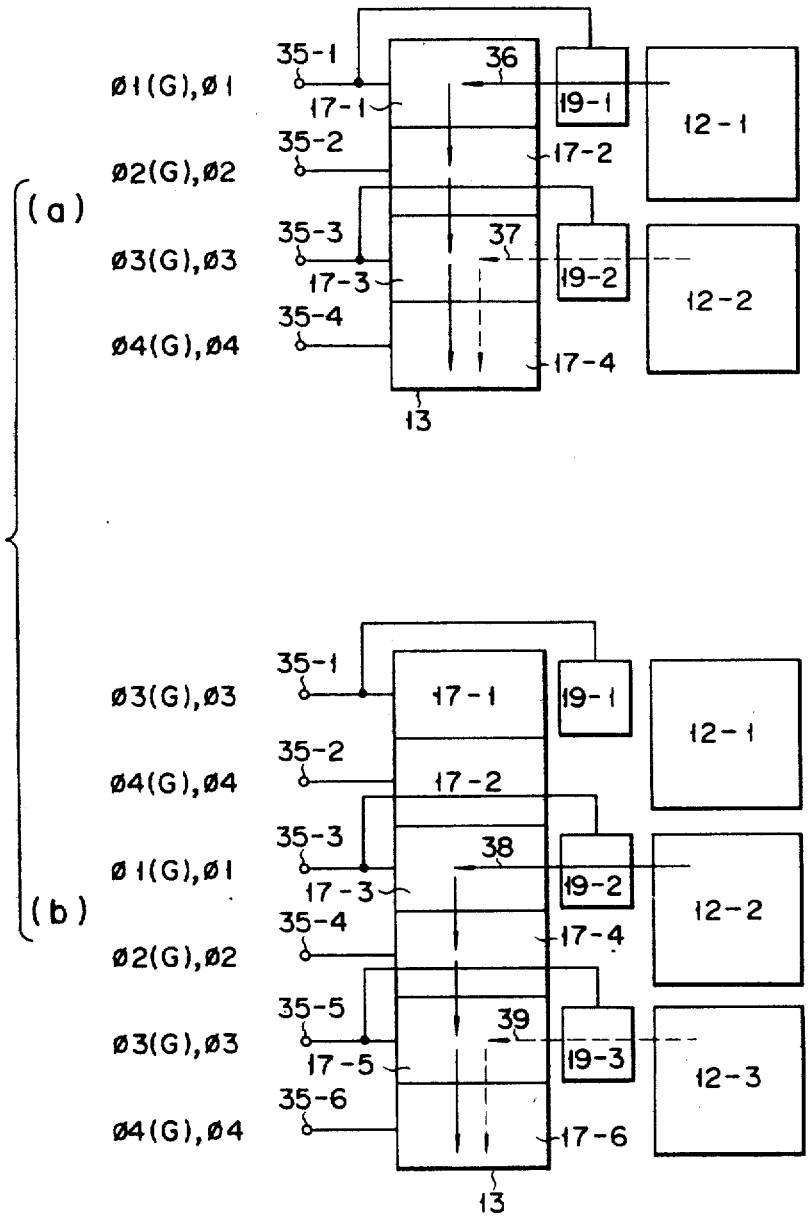

Though the charge gating electrodes 19 shown in FIGS. 1, 2 and 7 are separately provided between vertical transfer electrodes 13 and photodiodes 12, they can also be formed by extending vertical transfer electrodes 13 towards photodiodes 12, as shown in FIGS. 15 and 16.

Although an interline transfer type CCD device is disclosed in the embodiments mentioned above, the invention can also be applied to a frame transfer type CCD device. FIGS. 17–19 [shows] *show* such an embodiment of the invention. FIG. 17 schematically shows a sensor area of a frame transfer type CCD device and a filter array. The filter array 71 is formed by repeating the 2×4 filter element unit as shown in the right-hand portion of the filter array in FIG. 17.

Two vertical transfer electrodes 72 are provided for each filter element 73. Transfer electrodes 72 are preferably made transparent for passing the image light. Incident image light passing through filter element 73 and vertical transfer electrodes 72 into the semiconductor substrate 75 generates charge 74 corresponding to the intensity of the incident light, as shown in FIG. 18. During the storage period, the charges generated in the areas corresponding to two filter elements which are arrayed in adjacent pair of horizontal rows are mixed together. This is done by applying mixing signals $\Phi_1$–$\Phi_4$, to the vertical electrodes, as shown in FIG. 19. These signals have a waveform consisting of two different voltage levels VH and VL (e.g., VH equals 10 V, VL equals 1 V). Each of these signals, however, has a fixed level during the storage period. During the odd scanning field, the mixing signals shown in FIG. 19(a) are applied to transfer electrodes 72. That is, VH is applied to electrodes 72-2, 72-3 and $V_2$ is applied to electrodes 72-1, 72-4 (see FIGS. 17 and 19(a)). This causes a potential well to be formed under electrodes 72-2 and 72-3 and the charges generated in the areas under electrode 72-1, 72-2 gather into these wells, as shown in FIG. 18(a) which is a sectional view taken along line 18—18 of FIG. 17. It is understood from FIGS. 17 and 18(a) that the charges generated by the photosensors, arranged in every two pairs 80 of adjacent electrodes (e.g., 72-1, 72-2, 72-3 and 72-4), are mixed together, during the odd field scanning. After the storage period is over, the 4-phase transfer signals $\Phi_1$–$\Phi_4$ are applied to drive transfer electrodes 72 for transferring the mixed charges along the vertical direction towards the storage area (not shown).

During the even scanning field, the mixing signals shown in FIG. 19(b) are applied to transfer electrodes 72. During the storage period, VH (i.e., 10 V) is applied to electrodes 72-4, 72-5 and VL (i.e., 1 V) is applied to electrodes 72-3, 72-6, as shown in FIG. 17. This causes a potential well to be formed under electrodes 72-4, 72-5; in this well the charges are mixed, as shown in FIG. 18(b). It is clear that the charges generated by the photosensors, arranged in every two pairs 81 of adjacent electrodes (e.g., 72-3, 72-4, and 72-5, 72-6), are mixed together during the even [canning] *scanning* fields. After the storage period is over, the 4-phase transfer signals $\Phi_1$–$\Phi_4$ are used to drive transfer electrodes 72 for transferring the mixed charge along the vertical direction towards the storage area. In this embodiment, it is clear from FIG. 19 that the 4-phase transfer signals which are used in the odd and even fields have the same waveform except for their order.

I claim:

1. A solid-state color television camera device comprising:

a semiconductor substrate;

a photosensor array, formed on the substrate, having a plurality of photosensors arranged in horizontal and vertical rows, each photosensor generating a charge upon receipt of an image;

a vertical transfer means, positioned adjacent each vertical row of photosensors and responsive to vertical transfer signals, for receiving the charges generated by the adjacent photosensors and transferring the charges to a horizontal transfer means;

a charge mixing means, coupled to said vertical transfer means, for mixing the charges generated by the photosensors in two adjacent horizontal rows;

a horizontal transfer means, positioned adjacent one end of each vertical row of photosensors for receiving the charges transferred by the vertical transfer means, and transferring them as an output signal to an output terminal formed on the substrate;

a color filter array having a plurality of separate filter elements arranged in horizontal and vertical rows, each of said elements corresponding to a respective photosensor;

said color filter array comprising a plurality of unit filter arrays, each unit consisting of 2×4 filter elements of yellow (Ye), green (G), cyan (Cy) and white (W) colors.

2. A color television camera device according to claim 1, wherein the white filter elements pass the red, green and blue colors, the green filter elements pass the light of only the green color, the yellow filter elements pass the light of only the red and green colors, and the cyan filter element pass the light of only the green and blue colors.

3. A television camera device of claim 2 wherein the output signal of said horizontal transfer means comprises a first modulated color signal representing the signal along one horizontal row of photosensors and a second modulated color signal representing the signal along an adjacent horizontal row, said first modulated color signal comprising a signal modulated by a first and second primary colors having different phases, said second modulated color signal comprising a signal modulated by a first and second primary colors having the same phases.

4. A television camera device according to claim 3 wherein said first and second primary colors are red and blue, respectively.

5. A color television camera device according to claim 1 wherein each vertical transfer means comprises a plurality of vertical electrodes whereby two electrodes are provided for each photosensor, and said charge mixing means includes a charge gating electrode positioned between each photosensor and its corresponding two vertical transfer electrodes and responsive to gate control signals for gating and transferring the charge of from each photosensor to one of its corresponding electrodes;

a gate pulse generating means, coupled to each charge gating electrode, for producing said gate control signals for controlling the transfer of charges from each photosensors to its corresponding vertical transfer electrode before said vertical transfer signals are applied to the vertical transfer electrodes during every field scanning period of the television display system.

6. A television camera device according to claim 5 wherein said charge gating electrode is integrally formed with said one corresponding vertical transfer electrode.

7. A color television camera device according to claim 5 wherein said vertical transfer signals are four phase clock signals and said gate control signals are superimposed on said vertical transfer signals at the beginning of each vertical transfer period.

8. A color television camera device according to claim 5 wherein each of said one corresponding vertical transfer electrodes is connected to said gate pulse generating means, and said field scanning period includes an odd scanning period and an even scanning period;

wherein during said odd scanning period, said gate control signals drive, during a first gating sequence, the charge gating electrodes in odd horizontal rows together with each of said corresponding vertical transfer electrodes to transfer the charge into said corresponding vertical transfer electrode and then sequentially into the transfer electrodes of the succeeding horizontal rows and, during a second gating sequence, said gate control signals drive the charge gating electrodes in the next adjacent horizontal rows to transfer the charge from the next adjacent photosensor to one of its corresponding vertical transfer electrodes at the same time the charge from the preceding row has entered the corresponding vertical transfer electrode of the next adjacent photosensor; and wherein during said even scanning period, said gate control signals drive, during a first gating sequence, the charge gating electrodes in even horizontal row together with each of said corresponding vertical transfer electrodes to transfer the charge into said corresponding vertical transfer electrodes and then sequentially into the transfer electrodes of the succeeding horizontal rows and, during a second gating sequence, said gate control signals drive the charge gating electrodes in the next adjacent horizontal rows to transfer the charge from the next adjacent photosensor to one of its corresponding vertical transfer electrodes at the same time the charge from the preceding row has entered the corresponding vertical transfer electrode of the next adjacent photosensor.

9. A color television camera device according to claim 1 wherein each vertical transfer means comprises a plurality of vertical electrodes whereby two electrodes are provided for each photosensor and each filter element, whereby said charge mixing means mixes the charges in two adjacent vertical electrodes, each of which is positioned under a different filter element, by forming a potential well common to said two adjacent electrodes.

10. A color television camera device according to claims 1, 5 or 9, further comprising:

a first filter means coupled to said color image output signal for extracting a luminance signal (Y);

a second filter means coupled to said color image output signal for extracting low frequency components of the luminance signal (Y);

a band pass filtering means coupled to said color image output signal for extracting a modulated color signal;

a 1 H delay circuit coupled to said bandpass filtering means for producing a 1 H delayed output signal;

a summing means for summing said modulated output signals with said 1 H delayed output signal to produce a modulated red color signal;

a subtracting circuit for subtracting said modulated output signal with said 1 H delayed output signal to produce a blue modulated color signal;

a red signal demodulating means for demodulating said red modulated color signal to obtain a red color signal;

a blue signal demodulating means for demodulating said blue modulated color signal to obtain a blue color signal;

a color matrix means coupled to said blue and red signal demodulating means for producing a green color signal; and, a color encoder means for producing standard color television signals.

11. A color television camera device according to claim 9 wherein said first filter means passes frequencies below approximately 3 MHz, said second filter means passes frequencies below approximately 0.5 MHz and the band pass filter means passes frequencies from approximately 3 MHz to 4 MHz.

*12. A solid-state color television camera device comprising:*

*a semiconductor substrate;*

*a photosensor array, formed on the substrate, having a plurality of photosensors arranged in horizontal and vertical rows, each photosensor generating a charge upon receipt of an image;*

*a vertical transfer means, positioned adjacent each vertical row of photosensors and responsive to vertical transfer signals, for receiving the charges generated by*

*the adjacent photosensors and transferring the charges to a horizontal transfer means;*

*a charge mixing means, coupled to said vertical transfer means, for mixing the charges generated by the photosensors in two adjacent horizontal rows;*

*a horizontal transfer means, positioned adjacent one end of each vertical row of photosensors for receiving the charges transferred by the vertical transfer means, and transferring them as an output signal to an output terminal formed on the substrate;*

*a color filter array having a plurality of separate filter elements arranged in horizontal and vertical rows, each of said elements corresponding to a respective photosensor;*

*said color filter array, comprising a plurality of unit filter arrays, each unit consisting of 2×4 filter elements of yellow (Ye), green (G), cyan (Cy) or white (W) colors and including at least one element of the yellow (Ye) and cyan (Cy) colors.*

*13. The color television camera device of claim 12 wherein each of said unit filter arrays consists of 2×4 filter elements of yellow (Ye), cyan (Cy) and green (G).*

*14. The color television camera device of claim 12 wherein each of said unit filter arrays consists of 2×4 filter elements of yellow (Ye), cyan (Cy) and white (W).*

* * * * *